United States Patent [19]
Ishikura et al.

[11] Patent Number: 6,046,481
[45] Date of Patent: Apr. 4, 2000

[54] TRANSISTOR FOR PREVENTING A THERMAL RUNAWAY CAUSED BY TEMPERATURE RISE IN A BIAS CIRCUIT OF THE TRANSISTOR

[75] Inventors: Kouji Ishikura; Mikio Kanamori, both of Tokyo, Japan

[73] Assignee: NEC Corporation, Tokyo, Japan

[21] Appl. No.: 09/285,688

[22] Filed: Apr. 5, 1999

[30] Foreign Application Priority Data

Apr. 9, 1998 [JP] Japan ................................. 10-097199

[51] Int. Cl.⁷ .................................................... H01L 23/62
[52] U.S. Cl. .......................... 257/357; 257/358; 257/338; 257/536
[58] Field of Search ..................... 257/355, 357, 257/358, 359, 360, 1, 4, 5, 7, 655, 656, 536, 337, 336, 338, 903, 904

[56] References Cited

U.S. PATENT DOCUMENTS 5,780,900  7/1998  Suzuki et al. ........................... 257/335
5,932,918  8/1999  Krakauer ................................. 257/358

FOREIGN PATENT DOCUMENTS 01300703A  12/1989  Japan .
4-175002    6/1992  Japan .
08023237A   1/1996  Japan .

*Primary Examiner*—Donald L. Monin, Jr.
*Assistant Examiner*—Hoai Pham
*Attorney, Agent, or Firm*—McGinn & Gibb, P.C.

[57] ABSTRACT

A semiconductor device includes a bias circuit for applying a bias to a transistor in which the semiconductor comprises a two-terminal element, connected between an external power source and at least an input of the transistor, having a first conductive contact layer connected to the input of the transistor, a second conductive contact layer connected to the external power source, and a semiconductor layer having a semi-insulation intervened between the first and second conductive contact layers, thereby reducing the thermal runaway caused by temperature rise.

22 Claims, 8 Drawing Sheets

6,046,481

TRANSISTOR FOR PREVENTING A THERMAL RUNAWAY CAUSED BY TEMPERATURE RISE IN A BIAS CIRCUIT OF THE TRANSISTOR

BACKGROUND OF THE INVENTION

1. Field of the Invention

The present invention relates to a semiconductor device, more specifically to a transistor for preventing a thermal runaway caused by temperature rise in a bias circuit of the transistor.

2. Description of the Related Art

In case of a field effect transistor (hereinafter, referred to as FET) using a compound semiconductor, there has an advantage to make the limitation of its operating frequency high since the electron mobility of its material is high. However, operating the FET using the compound semiconductor at a high temperature causes a drain current to increase rapidly, so that the transistor breaks down by causing the thermal runaway.

FIG. 11 is a circuit diagram showing a bias circuit of FET in general. Hereinafter, the cause of thermal runaway in the FET using a compound semiconductor will be explained with reference to FIG. 11. For a purpose of setting a DC bias voltage, an FET 101 has a voltage split circuit constituted of a resistors R1 and R2 connected in series between the ground and an external bias-supplying power source Vgg, which supplies a voltage in between the resistors R1 and R2 to a gate G. A gate potential Vg1 of FET 101 in this case is represented by an expression (1) in consideration of a gate current Ig flown into the gate G from a drain.

$$Vg1 = \frac{R2}{R1 + R2} \cdot Vgg - \frac{R1 \cdot R2}{R1 + R2} \cdot Ig \qquad (1)$$

The bias circuit of FET shown in FIG. 11 has a characteristic such that a voltage drop increases caused by the resistance component represented by the second term of the expression (1) and the gate potential Vg1 rises, when increasing the gate current Ig. Because of this, when an ambient temperature rises in this case, the increase of a drain current Ids is induced since the gate current Ig increases exponentially. As a result of continuing the self-heat generation and temperature rise caused by the power consumption in the FET, the breakdown of FET occurs by causing the thermal runaway.

In such case of FET using the compound semiconductor, the thermal runaway occurring at the high temperature causes that the practical bias potential or gate potential Vg1 becomes low or shallow, since the gate current Ig increases as well as the voltage drop increases in the bias circuit. Thus, for the purpose of preventing the thermal runaway, the voltage drop of the bias circuit is made small in increasing temperature, thereby the gate potential Vg1 should not become low.

In contrast, a bias circuit of FET has been proposed with a Japanese Patent Application Laid-Open No. Hei4-175002 in which a diode is connected to a gate bias circuit in series and the negative temperature characteristic of the diode is used to reduce the increase of drain current Ids in temperature rise. FIG. 12 is a circuit diagram showing a bias circuit of FET proposed by the gazette. The bias circuit has a diode 103 connected, in forward direction, in series with a resistor R1 of a voltage split circuit constituted with a resistor R2, both the resistors of which are connected in series between a ground potential and a gate bias-supplying power source Vgg, for the purpose of setting a DC bias of an FET 102. The forward direction voltage of diode 103 decreases with the temperature rise to thereby indicate a negative temperature characteristic of approximately $-1.5$ mV/° C. Therefore, when the temperature increases from the room temperature to 100° C., for example, the voltage drop of diode 103 is decreased to about 0.15 volts. With this decrease of voltage drop at the diode 103, a gate potential Vg1 of FET 102 decreases to thereby reduce the increase of a drain current Ids.

However, in the bias circuit of FET, the reduction of increasing the gate potential Vg1 is not quite sufficient in the temperature rise. FIG. 13 is a graph showing, for example, the temperature dependency of gate current Ig for the FET using a compound semiconductor, that is, a characteristic example showing the gate current Ig ($\mu$A) to a channel temperature T (° C.). As shown in FIG. 13, the gate current Ig increases exponentially at 100° C. or over, and it reaches to several hundred times the value of room temperature at 170° C. Assuming that the values of resistors R1 and R2 are 1 k$\Omega$ respectively and the gate current Ig of FET 102 increases up to 900 $\mu$A at 170° C. as shown in FIG. 13, the gate potential Vg1 is decreased to 0.45 volts from that at the room temperature, which obtains from the expression (1). In contrast, the decrease of voltage drop at diode 103 caused by the temperature variation is to the extent of 0.1 volts. Thus, the decrease of voltage drop at the diode 103 is less in comparison with the variation of the gate potential Vg1 of FET 102 caused by the temperature variation. For this reason, the reduction of increasing the gate potential Vg1 is less in this case of the bias circuit of FET shown in FIG. 12.

Accordingly, such a bias circuit of FET does not follow the increase of gate potential caused by increasing the gate current exponentially. Such difficulty is also present in the case of increasing a base potential on the basis of a base current in a bipolar transistor. In addition, there is also difficulty not only for the case of transistor using a compound semiconductor, but also for a transistor using silicon material.

SUMMARY OF THE INVENTION

It is therefore an object of the present invention to provide a semiconductor device capable of reducing an input potential of the transistor on the basis of increasing an input current caused by temperature rise, reducing thermal runaway.

According to a first aspect of the present invention, there is provided a semiconductor device including a bias circuit for applying a bias to a transistor, in which the semiconductor device has a two-terminal element having a first conductive contact layer connected to an input of the transistor, a second conductive contact layer connected to an external power source, and a semiconductor layer having a semi-insulation intervened between the first and second conductive contact layers.

The two-terminal element may be connected between the input of transistor and the external power source, a resistor is connected in parallel with the two-terminal element, and the resistor being connected between the input and a ground.

The two-terminal element may be connected alone between the input and the external power source, and a resistor is connected between the input and the ground.

The two-terminal element may be disposed on a chip where the transistor is disposed on.

The two-terminal element may formed of two conductive contact layers each separated by the semiconductor layer having a semi-insulation formed on a substrate surface by penetrating the conductive contact layer with a boron ion-implanted into an area except a predetermined area masked of the substrate surface having the conductive contact layer, and the semiconductor layer having the semi-insulation intervened between the two conductive contact layers.

The two-terminal element may be formed of the two conductive contact layers each separated and formed on the substrate surface with a silicon ion-implanted into an area except a predetermined area masked of a surface of a semi-insulating substrate, and the semiconductor layer having the semi-insulation intervened between the two conductive contact layers.

Two-terminal element may be formed of the two conductive contact layers each separated and survived by a mesa-etching to penetrate the conductive contact layer with a predetermined area masked of the surface of the semi-insulating substrate having the conductive contact layers, and the semiconductor layer having the semi-insulation intervened between the two conductive contact layers.

The transistor may be either a field effect transistor or bipolar transistor.

The transistor may also be either a compound semiconductor or silicon semiconductor.

According to a second aspect of the present invention, there is provided with a semiconductor device including a bias circuit for applying a bias to a transistor, in which the semiconductor device comprises a first two-terminal element including a first conductive contact layer connected to an input of the transistor, a second conductive contact layer connected to an external power source and a semiconductor layer having a semi-insulation intervened between the first and second conductive contact layers, and a second two-terminal element including a first conductive contact layer connected to the input of the transistor, a second conductive contact layer connected to a ground and a semiconductor layer having a semi-insulation intervened between the first and second conductive contact layers.

According to such constitution of the present invention, at least the two-terminal element has a characteristic indicating that the resistance value decreases with increase of temperature. Thus, with the two-terminal element incorporated into the bias circuit of the transistor, the increase of the input potential can be reduced because the resistance value of the bias circuit decreases with the increase of temperature, even though the input current of transistor increases with the increase of temperature, reducing the thermal runaway of transistor.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Hereinafter, embodiments of the present invention will be described with reference to the drawings.

First Embodiment

Figure 1:
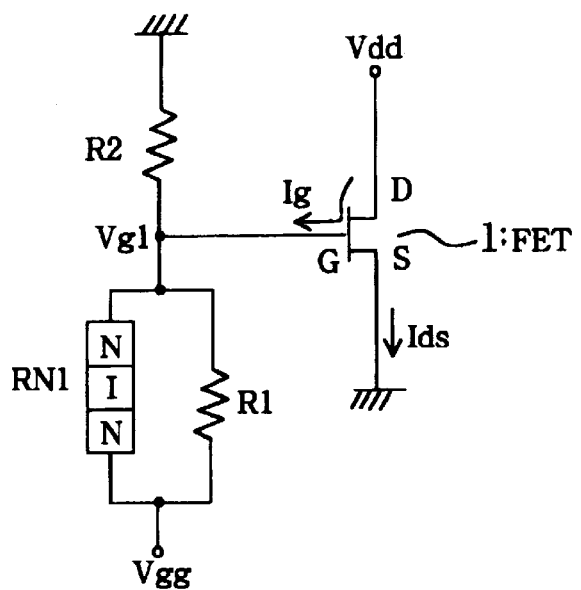
FIG. 1 is a circuit diagram showing a semiconductor device of a first embodiment in the present invention.
Figure 2:
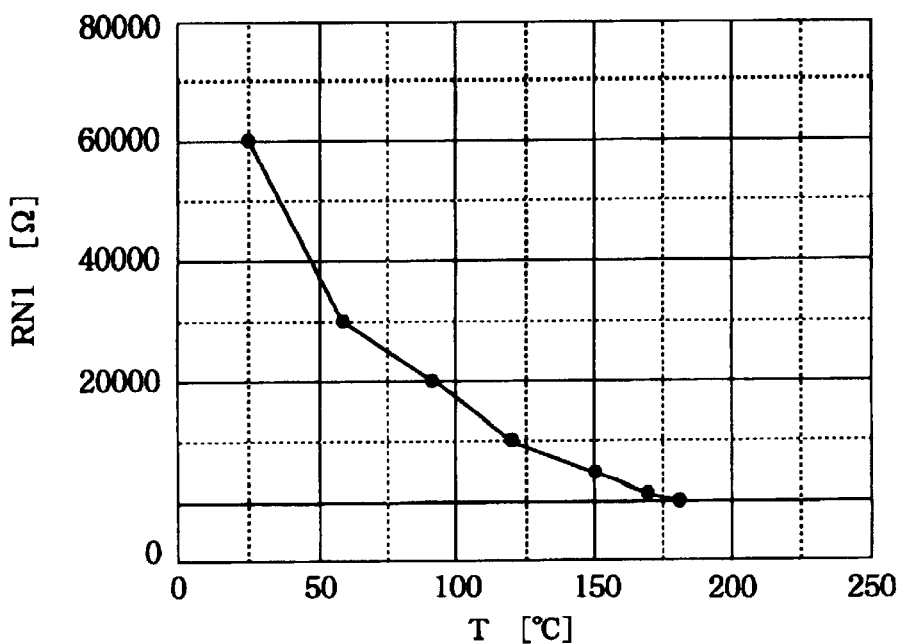
FIG. 2 is a graph showing a temperature characteristic of a resistance of a two-terminal element.
Figure 3:
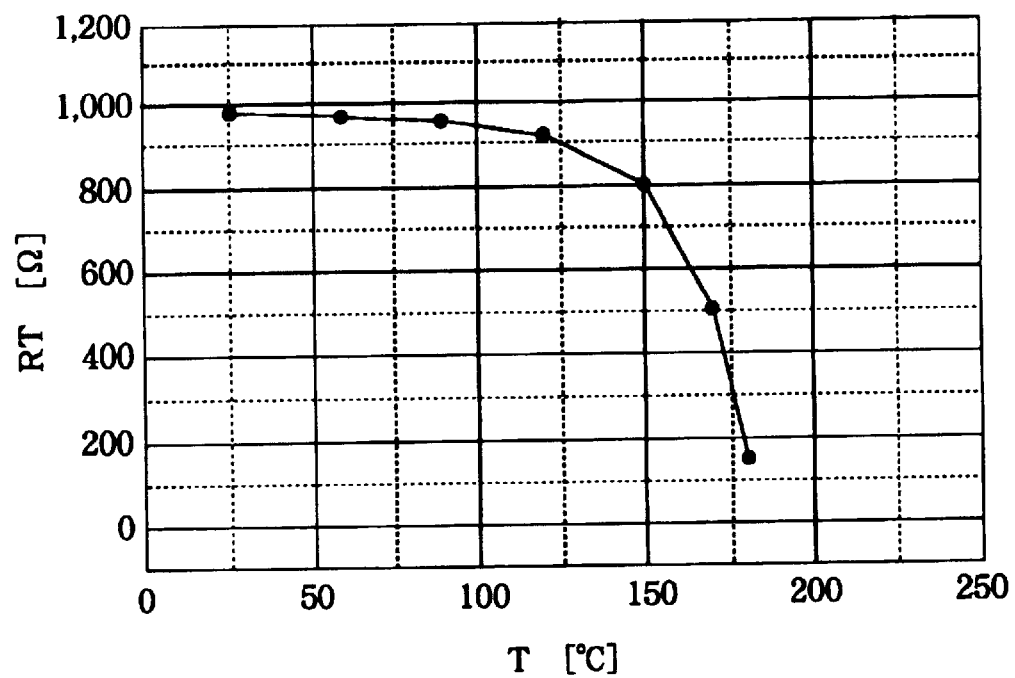
FIG. 3 is a graph showing a temperature characteristic for a combined resistance of the two-terminal element and a resistor.
Figure 4:
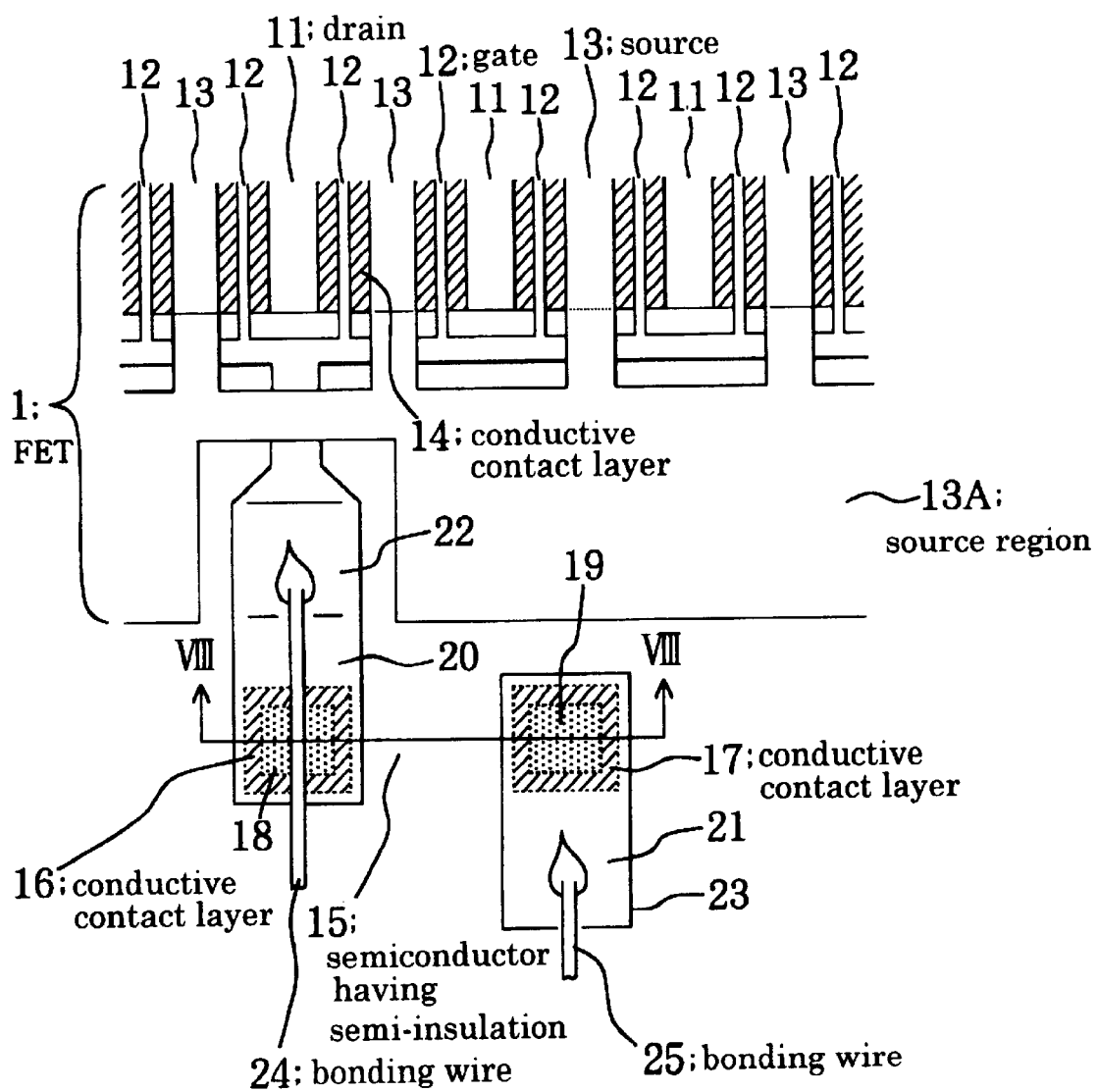
FIG. 4 is a layout diagram of the two-terminal element on a substrate.

A semiconductor device of a first embodiment is shown in FIG. 1 illustrating a circuit diagram. A temperature characteristic of a two-terminal element resistance is shown in FIG. 2 illustrating a graph. Another temperature characteristic for a combined resistance is shown in FIG. 3 illustrating a graph. A two-terminal element on a substrate is shown in FIG. 4 as a layout diagram.

The semiconductor device shown in FIG. 1 constitutes an FET 1 made up of a compound semiconductor, resistors R1 and R2, and a resistor RN1 as two-terminal element or NIN element which will be explained later. Referring to FIG. 1, a drain D of FET 1 is connected to a drain power source Vdd and a source thereof is connected to a ground. One end of resistor R2 is also connected to the ground. The other end of resistor R2 is connected to a node where one ends of resistor R1 and resistor RN1 are connected, and the other ends of resistors R1 and RN1 are connected to a gate bias-supplying power source Vgg in parallel. A gate G of FET 1 is connected to a middle node having a voltage in between the resistors R1 and R2 which constitute a voltage split circuit, thereby making the voltage to be set to a gate potential Vg1.

The NIN element made up of the resistor RN1 has namely a semiconductor layer (I or intrinsic) having a semi-insulation intervened between two N-type conductive contact layers (N or negative). A resistor made up of the NIN element has a characteristic indicating that its resistance value decreases remarkably with the increase of temperature. This is because the n number of electrons present in the semiconductor layer vary exponentially as represented by an expression (2).

$$n \exp(-E/kT) \tag{2}$$

where E denotes electron energy (eV), k denotes Boltzmann constant and T is absolute temperature (K).

In a manufacturing process of the FET 1, a semiconductor layer having a semi-insulation is formed on a predetermined area of an N-type semiconductor layer formed on a semi-insulation substrate by the boron-ion implantation, which produces an NIN element or resistor RN1. FIG. 2 indicates a temperature dependency of the resistor RN1 formed on the substrate on which the FET 1 is also formed as so-called single chip. The NIN element has a 200 μm interval between two conductive contact layers and 100 μm in lateral width. FIG. 2 also indicates a characteristic of the resistor RN1 as NIN element in the case where the requirement of the boron-ion implantation specifies that an acceleration voltage is 70 keV and a does is in the range of $10^{13}$ to $10^{14}$ cm$^{-2}$ and also the case where a heat treatment is applied thereto for a half hour under 480° C., after the boron-ion implantation. Thus, the graph indicates that the resistance of resistor RN1 decreases from about 60 kΩ at a normal temperature (25° C.) to about 1 kΩ at 170° C.

In addition, a parallel resistance value RT obtained from the resistor RN1 made up of the NIN element connected with an ordinary resistor R1 in parallel is represented by an expression (3).

$$RT = \frac{R1 \cdot RN1}{R1 + RN1} \quad (3)$$

The parallel resistance value RT also indicates the negative temperature characteristic, that is, the parallel resistance value RT obtained from the resistors RN1 and R1 shown in FIG. 2 decreases from about 1 kΩ at the normal temperature (25° C.) as shown in FIG. 3 and decreases remarkably over 100° C., thereby indicating about 500Ω at 170° C. when R1=1 kΩ.

In the case where a voltage split circuit in the gate bias circuit shown in FIG. 1 has the resistor R2 connected in series with the resistor RN1 made up of the NIN element and the ordinary resistor R1 in parallel, the gate potential Vg1 of FET 1 is represented by an expression (4).

$$Vg1 = \frac{R2}{RT + R2} \cdot Vgg - \frac{R1 \cdot R2}{RT + R2} \cdot Ig \quad (4)$$

Figure 13:
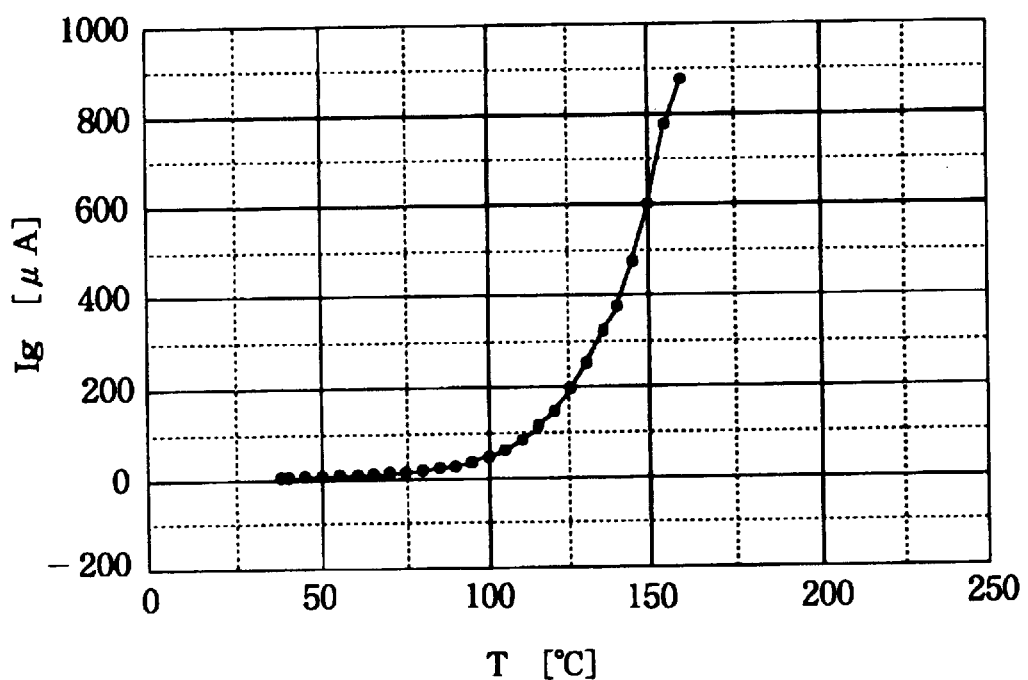
FIG. 13 is a graph showing a temperature dependency of the gate current of FET using a compound semiconductor.

Assuming that the resistance value of resistor R1 is 1 kΩ and that of resistor R2 is 1 kΩ and the resistor RN1 having the characteristic shown in FIG. 2 is connected to the resistor R1 in parallel, the gate potential Vg1 is 1.75 volts at the room temperature (25° C.) when the gate bias-supplying voltage Vgg is 3.5 volts. With the temperature rise, when the gate current Ig of FET 1 increases up to 900 μA as shown in FIG. 13, the gate potential Vg1 becomes 2.03 volts obtained from the expression (4), reducing 0.28 volts from that in the case of room temperature. Thus, the increase of drain current Ids is reduced, thereby reducing the thermal runaway.

FIG. 4 is a layout showing the NIN element on the substrate in the first embodiment. Referring to FIG. 4, a plurality of FETs each having a gate 12 and a source 13 adjacent to a drain 11 are formed on a substrate of a semi-insulation in parallel in the lateral direction. Each of the sources 13 is then connected to a source region 13A to thereby connect each of the FETs in parallel, which constitutes an FET 1 shown in FIG. 1. An N-type conductive contact layer 14 is formed on between the drain 11 and gate 12 and between the gate 12 and source 13 indicated by the slant lines on FIG. 4, so that the current is readily flown thereto. Two N-type conductive contact layers 16, 17 are also formed on a region adjacent to the source region 13A of the substrate. The N-type conductive contact layers 16, 17 are connected to gold leads 20, 21 through ohmic metals 18, 19, respectively. Each part of the gold leads 20, 21 then becomes a gate pad 22 and an NIN element bonding pad 23. A bonding wire 24 connected to the node of connecting both external resistors R1 and R2 shown in FIG. 1 and a bonding wire 25 connected to the gate bias-supplying power source Vgg, are welded to the gate pad 22 and NIN element boding pad 23, respectively. In the constitution shown in FIG. 4, the NIN element is made up of the N-type conductive contact layer 16, semiconductor layer having semi-insulation 15 and N-type conductive contact layer 17.

Second Embodiment

Figure 5:
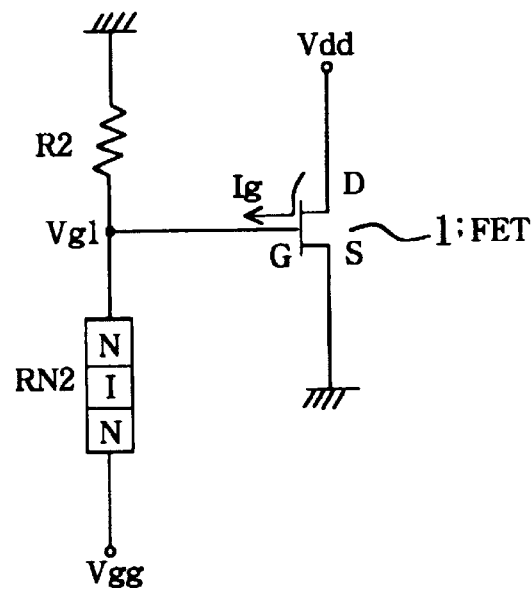
FIG. 5 is another circuit diagram showing a semiconductor device of a second embodiment in the present invention.

A semiconductor device of the second embodiment is shown in FIG. 5 with a circuit diagram illustrated. A temperature characteristic of a resistance value specified by the NIN element is shown in FIG. 6 as a graph.

Referring to FIG. 5, the semiconductor device constitutes an FET 1 made up of a compound semiconductor, a resistor R2 and a resistor RN2 made up of the NIN element. In the semiconductor device, a drain D of the FET 1 is connected to a drain power source Vdd and a source S thereof is grounded. One end of the resistor R2 is grounded and the other end of the resistor R2 is connected to the one end of resistor RN2. The other end of resistor RN2 is connected to a gate-bias supplying power source Vgg. A gate G of FET 1 is connected to a middle node having a voltage in between the resistors R2 and RN2 constituting a voltage split circuit, thereby making the voltage to be set to a gate potential Vg1.

Similarly to the resistor RN1 described in the first embodiment, the resistor RN2 or NIN element has a 200 μm interval between the two conductive contact layers and 100 μm in lateral width. FIG. 6 indicates a temperature dependency of the resistor RN2 in the case where the requirement of the boron-ion implantation specifies that an acceleration voltage is 70 keV and a does is $10^{14}$ cm$^{-2}$, and the resistance value of the semiconductor layer having semi-insulation is so set that it becomes about 1 kΩ at the normal temperature, thereby remarkably making a small resistance value at high temperature.

Figure 6:
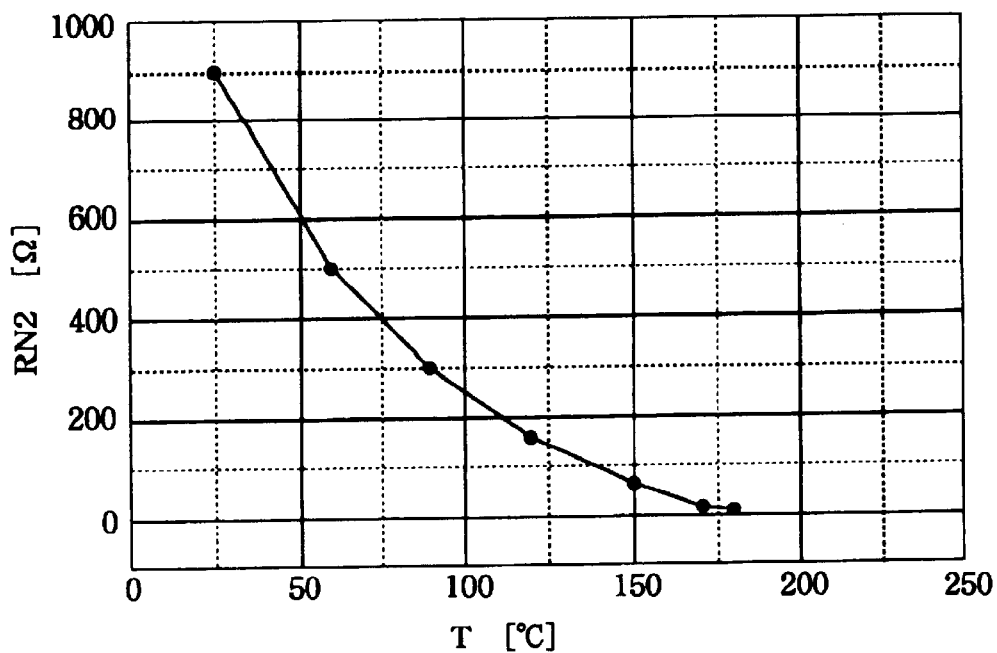
FIG. 6 is a graph showing a temperature characteristic for a resistance of the two-terminal element shown in FIG. 5.

In the semiconductor device of this embodiment, the gate bias circuit shown in FIG. 5 uses the resistor RN2 made up of the NIN element having a characteristic shown in FIG. 6, so that the semiconductor device can follow a case such that the temperature characteristic of a gate current Ig varies remarkably at a low temperature state as shown in FIG. 13.

Third Embodiment

Figure 7:
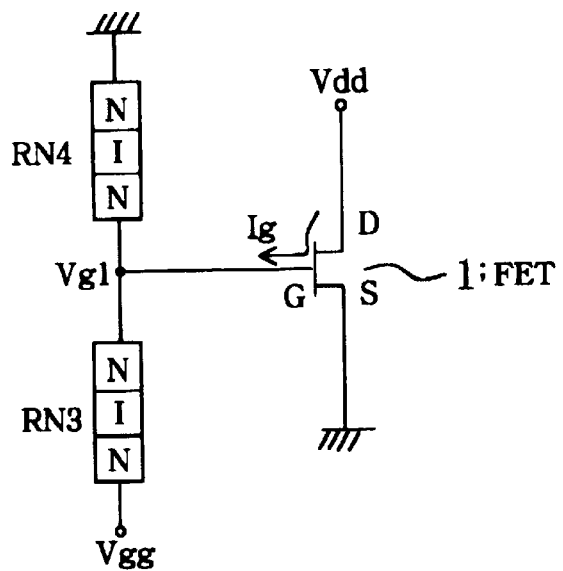
FIG. 7 is another circuit diagram showing a semiconductor device of a third embodiment in the present invention.

A semiconductor device in the third embodiment is shown in FIG. 7 illustrating a circuit diagram.

The semiconductor device constitutes an FET 1 made up of a compound semiconductor and resistors RN3, RN4 made up of the NIN element. In this case, a drain D of FET 1 is connected to a drain power source Vdd and a source S is grounded. One end of the resistor RN4 is grounded and the other end of resistor RN4 is connected to one end of the resistor RN3. The other end of resistor RN3 is connected to a gate bias-supplying power source Vgg. A gate G of FET 1 is connected to a middle node having a voltage in between the resistors RN3 and RN4 constituting a voltage split circuit, thereby making the voltage to be set to a gate potential Vg1.

Similarly to the first embodiment, the resistors RN3 and RN4 have a 200 μm interval between the two conductive contact layers and 100 μm in lateral width. Also similarly to the second embodiment, the requirement of the boron-ion implantation also specifies that an acceleration voltage is 70 keV and a does is $10^{14}$ cm$^{-2}$, thereby making the resistance value to be set to about 1 kΩ at the room temperature.

In this case, due to both the resistors RN3 and RN4 having the same temperature characteristic, the first term of the expression (1) representing the gate potential Vg1 becomes constant against the temperature rise. The second term of the expression (1) has also a tendency so that both the decrease of resistance and the increase of gate current Ig may indicate inversely at the temperature rise. Therefore, in the bias circuit shown in FIG. 7, even though the gate current Ig of FET 1 increases up to 900 μA at 170° C., caused by the temperature rise as shown in FIG. 13, the variation of gate potential Vg1 remains 0.01 volts or less, reducing the cause of thermal runaway.

Fourth Embodiment

A fabricating method of the NIN element will be described hereinafter. First, the N-type conductive contact layer 14 shown in FIG. 4 is provided for operating the FET 1 in this case. That is, a current is readily flown into the region of N-type conductive contact layer 14 while it is not readily flown into the other region thereof. Therefore, the N-type conductive contact layer of FET is fabricated by one of the following methods.

As to a first method, with use of a substrate or wafer having an N-type conductive contact layer thereon, the crystal part except the FET is demolished by the boron-ion implantation to thereby make a semi-insulation.

As to a second method, the silicon is ion-implanted into a region of the FET alone on a semi-insulation substrate to form an N-type conductive contact layer.

As to a third method, with use of a substrate or wafer having an N-type conductive contact layer thereon, a part except the FET is removed by an etching process to expose a semiconductor having semi-insulation on a substrate.

In any fabrication methods described above, a plurality of the NIN elements each having a structure described above can be fabricated simultaneously in the FET fabricating steps. As is described above, a specific process is not required for fabricating the NIN element in addition to the ordinary FET fabricating steps.

The N-type conductive contact layer of NIN element has an electrical characteristic similar to that of a region for operating the FET. An ohmic metal is deposited on the N-type conductive contact layer and annealed, and gold leads are formed for electrically contacting those with the N-type conductive contact layers of NIN element. A region except the gold leads is then coated with a silicon oxide ($S_iO_2$) in order of protecting its surface.

Fifth Embodiment

Figure 8:
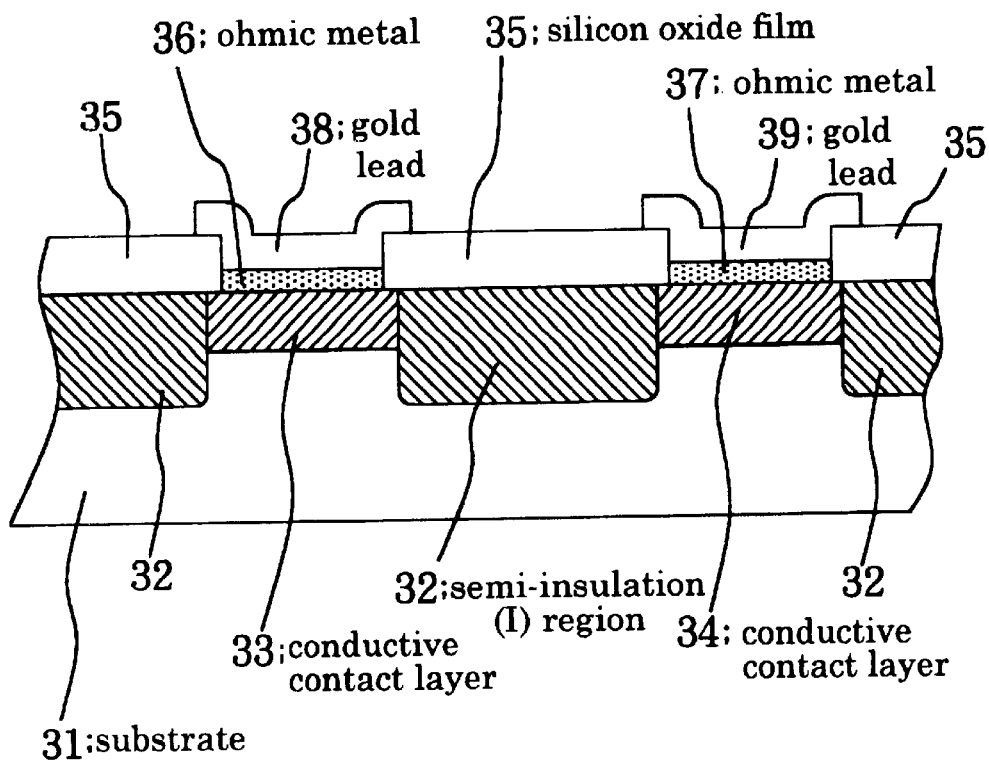
FIG. 8 is a schematic sectional view, indicated by the arrows VIII—VIII on FIG. 4, showing a first structural example of the two-terminal element in a fifth embodiment of the present invention.

FIG. 8 is a schematically illustrated cross sectional view of an NIN element as a first example which is indicated by the arrows VIII—VIII on FIG. 4. Referring to FIG. 8, N-type conductive contact layers 33 and 34 are formed on a substrate 31, and an NIN element is formed on the substrate 31 on which FET 1 is also formed as so-called single chip with semi-insulation regions 32 as intrinsic (I) formed by the boron-ion implantation.

In the fabrication steps of FET 1 shown in FIG. 4, the boron ion is implanted into the N-type conductive contact layers 33, 34 formed on the substrate 31 to thereby demolish the crystal of the layers and form the semi-insulation regions 32 as intrinsic (I), forming a region of NIN element constituted of the N-type conductive contact layer 33, semi-insulation region 32 as intrinsic (I) and N-type conductive contact layer 34. A silicon oxide film 35 is then formed on the semi-insulation regions 32, but the silicon oxide films on the N-type conductive contacts 33, 34 are made opened. Ohmic metals 36, 37 are then formed on the opening part of N-type conductive contact layers 33, 34 and connected with gold leads 38 and 39, respectively.

In the case of constitution shown in FIG. 8, the requirement of the boron-ion implantation specifies that an acceleration voltage is 70 keV and a does is in a range of $10^{13}$ to $10^{14}$ cm$^{-2}$ and that a heat treatment is also applied thereto for a half hour under the temperature of 480° C., after the boron-ion implantation. With such process, the NIN element can be formed as specified a resistance value in the range from 6 kΩ to 1 kΩ at the normal temperature. Further, such resistance value of the NIN element can also be formed with the does decreased without applying the heat treatment. The resistance value thereof can also be changed with the shape of NIN element changed.

Fabrication steps of the NIN element shown in FIG. 8 will substantially follow, as a first example.

For a first step, a photoresist is applied to the surface of substrate 31 or wafer having the N-type conductive contact layers 33, 34 thereon, and parts of the N-type conductive contact layers 33, 34 are masked so as to cover the FET and NIN element.

For a second step, with the crystal demolished by a boron-ion implantation, the semi-insulation region 32 is formed as intrinsic (I). After the boron-ion implantation, an annealing treatment may be applied thereto, as required.

For a third step, after forming a gate of the FET, a silicon oxide film is grown on the entire surface.

For a fourth step, in the step of depositing ohmic metals 36, 37 on the drain and source, the silicon oxide film 35 on NIN element is opened at the same time of opening the silicon oxide film 35 on the drain and source. The ohmic metals 36, 37 are then deposited on the drain and source.

For a fifth step, in a step of forming the drain, source and pads for each, the gold leads 38, 39 are formed on the ohmic metals 36, 37 with a gold plating applied, completing the NIN element.

Six Embodiment

Figure 9:
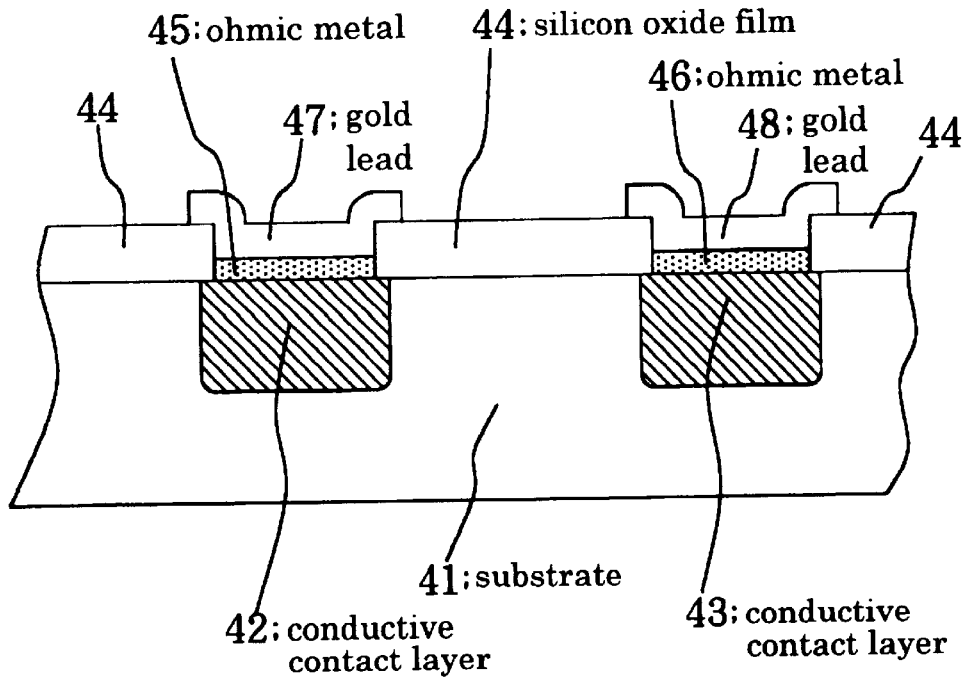
FIG. 9 is another schematic sectional view showing a second structural example of the two-terminal element in a sixth embodiment of the present invention, which is indicated by the arrows VIII—VIII on FIG. 4.

FIG. 9 is a schematically illustrated cross sectional view of an NIN element as a second example which is similar to the first example indicated by the arrows VIII—VIII on FIG. 4. FIG. 9 shows an arrangement of the NIN element using a substrate 41 without having an N-type conductive contact layer thereon. The NIN element is formed on the substrate 41 where FET 1 is also formed thereon as a single chip with N-type conductive contact layers 42, 43 formed by the silicon-ion implantation.

In the fabrication steps of FET 1 shown in FIG. 4, the N-type conductive contact layers 42, 43 are formed by the silicon-ion implantation on the substrate 41 to thereby form a region for an NIN element made up of the N-type conductive contact layer 42, the substrate 41 and N-type conductive contact layer 43. A silicon oxide film 44 is also formed on the substrate 41, but the parts of silicon oxide films 44 are made opened at the N-type conductive contact layers 42, 43 on which ohmic metals 45, 46 are formed. The ohmic metals 45, 46 are then connected to gold leads 47, 48, respectively.

Fabrication steps of the NIN element shown in FIG. 9 will substantially follow, as a second example.

For a first step, the semiconductor substrate 41 or wafer of semi-insulation is masked by a photoresist, except parts of the FET and N-type conductive contact layers 42, 43.

For a second step, with the silicon-ion implantation, since the crystal is demolished right after the ion implantation, the annealing treatment is applied thereto for 20 minutes under the temperature of 800° C. due to restoring the crystal.

For a third step, after forming a gate of the FET, a silicon oxide film 44 is grown on the entire surface.

For a fourth step, in the step of depositing ohmic metals 45, 46 on the drain and source, the silicon oxide film 44 on NIN element is made opened at the same time of opening the silicon oxide film 44 on the drain and source. The ohmic metals 45, 46 are then deposited on the drain and source.

For a fifth step, in a step of forming the drain, source and pads for each, the gold leads are formed on the ohmic metals 45, 46 with a gold plating applied, completing the NIN element.

Seventh Embodiment

Figure 10:
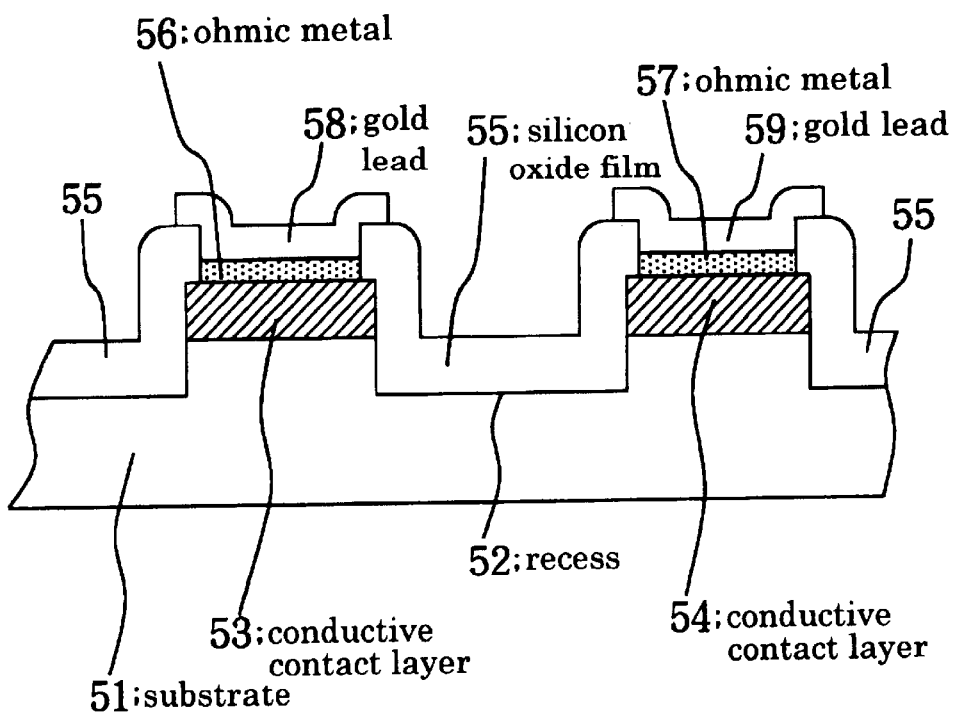
FIG. 10 is another schematic sectional view showing a third structural example of the two-terminal element in a seventh embodiment of the present invention, which is indicated by the arrows VIII—VIII on FIG. 4.
Figure 11:
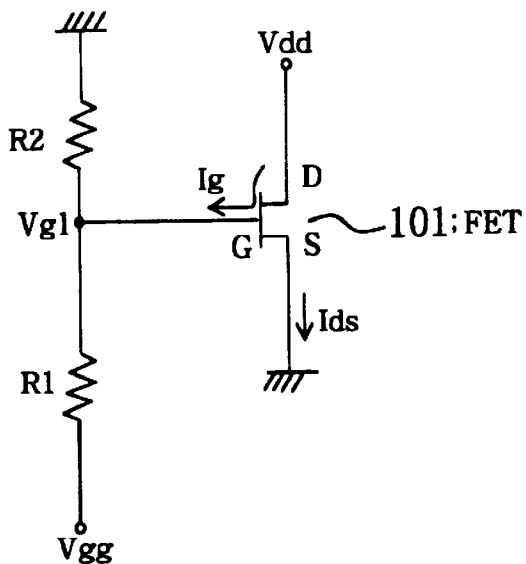
FIG. 11 is a circuit diagram of a bias circuit for FET in general, for explaining a related art.
Figure 12:
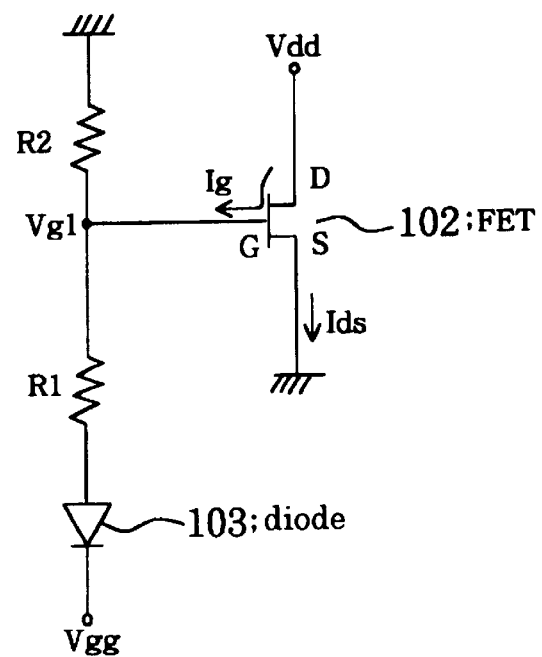
FIG. 12 is another circuit diagram of a bias circuit for FET, for explaining a related art.

FIG. 10 is a schematically illustrated cross sectional view of an NIN element as a third example which is similar to the first example indicated by the arrows VIII—VIII on FIG. 4. FIG. 10 shows an arrangement of the NIN element that uses a substrate 51 having N-type conductive contact layers 53, 54 thereon in which the mesa-etching process is applied to the N-type conductive contact layers to expose the substrate 51 and form the NIN element on the substrate 51 where FET 1 is also formed as so-called single chip.

In the fabrication steps of FET 1 shown in FIG. 4, the mesa-etching process is applied to the semiconductor substrate 51 having a semi-insulation forming the N-type conductive contact layer thereon to thereby form a recess 52. The substrate 51 is therefore exposed to be divided into the N-type conductive contact layers 53 and 54 and form a region of an NIN element made up of the N-type conductive contact layer 53, substrate 51 and N-type conductive contact layer 54. A silicon oxide film 55 is formed on the entire surface including the recess 52, but the parts of the silicon oxide film 55 are made opened at the N-type conductive contact layers 53, 54. Ohmic metals 56, 57 are formed on the opening parts of the N-type conductive contact layers 53, 54 and are connected to gold leads 58, 59, respectively.

Fabrication steps of the NIN element shown in FIG. 10 will substantially follow, as a third example.

For a first step, of the entire surface of substrate 51 or wafer having a semi-insulation on which the N-type conductive contact layers 53 and 54 are formed, the parts of FET and N-type conductive contact layer of NIN element are masked by a photoresist.

For a second step, with the sulfuric acid-wet etching process applied thereto, the non-masked N-type conductive contact layer is removed so as to expose the substrate 51, so that the part of N-type conductive contact layer remains as mesa type.

For a third step, after forming a gate of the FET, a silicon oxide film 55 is grown on the entire surface.

For a fourth step, in the step of depositing ohmic metals 56, 57 on the drain and source, the silicon oxide film 55 on the NIN element is made opened at the same time of opening the silicon oxide film 55 on the parts of the drain and source. The ohmic metals 56, 57 are then deposited on the drain and source.

For a fifth step, in a step of forming the drain, source and pads for each, the gold leads are formed on the ohmic metals 56, 57 with a gold plating applied, completing the NIN element.

According to the semiconductor device described above, the NIN element made up of a resistor used for the gate bias circuit can be formed with the fabrication steps of FET, making the NIN element small and manufacturing it in low cost. The NIN element is arranged on a chip where the FET is also arranged on it, causing the NIN element to make sensitive in response to the temperature variation of FET and making it to control the bias potential following just as the temperature of FET varies. In the case where the NIN element is not arranged on a single chip where the FET is also arranged, the NIN element may be desirably arranged adjacent to the FET.

In the embodiments as described above, the transistor may be a bipolar transistor besides the FET. The material of transistor may be not only a compound semiconductor, but silicon and germanium can also be used. A single type of FET is applicable besides the parallel type FET shown in FIG. 4.

In the embodiments as also described above, the NIN element is made up of the N-type conductive contact layer—the semiconductor having semi-insulation—the N-type conductive contact layer. A PIP (Positive-Intrinsic-Positive) element may also be used instead of the NIN element so that it is made up of a P-type conductive contact layer—a semiconductor layer having a semi-insulation—a P-type conductive contact layer.

It is thus apparent that the present invention is not limited to the above embodiments but may be changed and modified without departing from the scope and spirit of the invention.

Finally, the present application claims the priority of Japanese Patent Application No. Hei10-097199 filed on Apr. 9, 1998, which is herein incorporated by reference.

What is claimed is:

1. A semiconductor device including a bias circuit for applying a bias to a transistor, the semiconductor comprising a two-terminal element, connected between an external power source and at least an input of the transistor, having a first conductive contact layer connected to the input of the transistor, a second conductive contact layer connected to the external power source, and a semiconductor layer having a semi-insulation intervened between the first and second conductive contact layers.

2. A semiconductor device according to claim 1, wherein the input of the transistor includes one of a gate and base of the transistor.

3. A semiconductor device according to claim 1, wherein the two-terminal element is connected between the input and the external power source in parallel with a resistor, and the resistor being connected between the input and a ground.

4. A semiconductor device according to claim 1, wherein the two-terminal element is connected alone between the input and the external power source, and a resistor is connected between the input and a ground.

5. A semiconductor device according to claim 1, wherein the two-terminal element is disposed on a chip where the transistor is disposed on.

6. A semiconductor device according to claim 1, wherein the two-terminal element is formed of two conductive contact layers each separated by the semiconductor layer having the semi-insulation formed on a substrate surface by penetrating the conductive contact layer with a boron ion-implanted into an area except a predetermined area masked of the substrate surface having the conductive contact layer, and the semiconductor layer having the semi-insulation intervened between the two conductive contact layers.

7. A semiconductor device according to claim 1, wherein the two-terminal element is formed of the two conductive contact layers each separated and formed on the substrate surface with a silicon ion-implanted into an area except a predetermined area masked of a surface of a semi-insulating substrate, and the semiconductor layer of the semi-insulation intervened between the two conductive contact layers.

8. A semiconductor device according to claim 1, wherein the two-terminal element is formed of the two conductive contact layers each separated and survived by a mesa-etching to penetrate the conductive contact layer with a predetermined area masked of the surface of the semi-insulating substrate having the conductive contact layers, and the semiconductor layer of the semi-insulation intervened between the two conductive contact layers.

9. A semiconductor device according to claim 1, wherein the transistor includes a field effect transistor.

10. A semiconductor device according to claim 1, wherein the transistor includes a bipolar transistor.

11. A semiconductor device according to claim 1, the transistor is comprised of a compound semiconductor.

12. A semiconductor device according to claim 1, wherein the transistor is comprised of a silicon semiconductor.

13. A semiconductor device including a bias circuit for applying a bias to a transistor, the semiconductor device comprising:

a first two-terminal element including a first conductive contact layer connected to an input of the transistor, a second conductive contact layer connected to an external power source and a semiconductor layer having a semi-insulation intervened between the first and second conductive contact layers; and a second two-terminal element including a first conductive contact layer connected to the input, a second conductive contact layer connected to a ground and a semiconductor layer having a semi-insulation intervened between the first and second conductive contact layers.

14. A semiconductor device according to claim 13, wherein the input of the transistor includes one of a gate and base of the transistor.

15. A semiconductor device according to claim 13, wherein the first and second two-terminal elements are disposed on a chip where the transistor is disposed on.

16. A semiconductor device according to claim 13, wherein each of the first and second two-terminal elements is formed of two conductive contact layers each separated by the semiconductor layer having a semi-insulation formed on a substrate surface by penetrating the conductive contact layer with a boron ion-implanted into an area except a predetermined area masked of the substrate surface having the conductive contact layer, and the semiconductor layer having the semi-insulation intervened between the two conductive contact layers.

17. A semiconductor device according to claim 13, wherein each of the first and second two-terminal elements is formed of the two conductive contact layers each separated and formed on the substrate surface with a silicon ion-implanted into an area except a predetermined area masked of a surface of a semi-insulating substrate, and the semiconductor layer of the semi-insulation intervened between the two conductive contact layers.

18. A semiconductor device according to claim 13, wherein each of the first and second two-terminal elements is formed of the two conductive contact layers each separated and survived by a mesa-etching to penetrate the conductive contact layer with a predetermined area masked of the surface of the semi-insulating substrate having the conductive contact layers, and the semiconductor layer of the semi-insulation intervened between the two conductive contact layers.

19. A semiconductor device according to claim 13, wherein the transistor includes a field effect transistor.

20. A semiconductor device according to claim 13, wherein the transistor includes a bipolar transistor.

21. A semiconductor device according to claim 13, wherein the transistor is comprised of a compound semiconductor.

22. A semiconductor device according to claim 13, wherein the transistor is comprised of a silicon semiconductor.

* * * * *